United States Patent [19]
Laskaris et al.

[11] Patent Number: 5,874,882
[45] Date of Patent: Feb. 23, 1999

[54] OPEN AND SHIELDED SUPERCONDUCTIVE MAGNET

[75] Inventors: Evangelos Trifon Laskaris, Niskayuna; Michael Anthony Palmo, Ballston Spa; Michele Dollar Ogle, Burnt Hills; Bruce Campbell Amm, Clifton Park, all of N.Y.

[73] Assignee: General Electric Company, Schenectady, N.Y.

[21] Appl. No.: 26,390

[22] Filed: Feb. 19, 1998

[51] Int. Cl.$^6$ ........................................... H01F 5/00
[52] U.S. Cl. .......................... 335/299; 335/216; 324/318
[58] Field of Search ........................... 335/216, 296–301; 324/318–320

[56] References Cited

U.S. PATENT DOCUMENTS

| | | | |
|---|---|---|---|
| 5,345,208 | 9/1994 | Dorri et al. | 335/301 |
| 5,347,252 | 9/1994 | Ries | 335/299 |
| 5,410,287 | 4/1995 | Laskaris et al. | 335/216 |
| 5,436,607 | 7/1995 | Chari et al. | 335/216 |
| 5,446,434 | 8/1995 | Dorri et al. | 335/301 |
| 5,448,214 | 9/1995 | Laskaris | 335/301 |
| 5,517,168 | 5/1996 | Dorri et al. | 335/301 |
| 5,517,169 | 5/1996 | Laskaris et al. | 335/301 |
| 5,539,366 | 7/1996 | Dorri et al. | 335/297 |
| 5,565,831 | 10/1996 | Dorri et al. | 335/216 |
| 5,701,112 | 12/1997 | Brown | 335/216 |

*Primary Examiner*—Lincoln Donovan
*Attorney, Agent, or Firm*—Douglas E. Erickson; Marvin Snyder

[57] ABSTRACT

An open superconductive magnet useful in magnetic resonance imaging (MRI) applications. The magnet has two spaced apart assemblies, wherein each assembly has a magnetizable pole piece and a magnetizable ring radially spaced outwardly apart from, and at least partially longitudinally overlapping, the pole piece. A superconductive main coil is positioned radially between the pole piece and the ring. A superconductive shielding coil is positioned radially outward from the superconductive main coil and longitudinally outward from the longitudinally outer end of the ring.

15 Claims, 4 Drawing Sheets

OPEN AND SHIELDED SUPERCONDUCTIVE MAGNET

FIELD OF THE INVENTION

The present invention relates generally to an open superconductive magnet used to generate a uniform magnetic field, and more particularly to such a magnet having shielding to protect the area around the magnet from stray magnetic fields originating from the magnet.

BACKGROUND OF THE INVENTION

Superconductive magnets include those superconductive magnets which are part of a magnetic resonance imaging (MRI) system used in various applications such as medical diagnostics. Known superconductive magnets include liquid-helium-cooled and cryocooler-cooled superconductive magnets. Typically, the superconductive coil assembly includes a superconductive main coil surrounded by a first thermal shield surrounded by a vacuum enclosure. A cryocooler-cooled magnet preferably also includes a cryocooler coldhead externally mounted to the vacuum enclosure, having its first cold stage in thermal contact with the thermal shield, and having its second cold stage in thermal contact with the superconductive main coil. A liquid-helium-cooled magnet preferably also includes a liquid-helium vessel surrounding the superconductive main coil and a second thermal shield which surrounds the first thermal shield which surrounds the liquid-helium vessel.

Known superconductive magnet designs include closed magnets and open magnets. Closed magnets typically have a single, tubular-shaped superconductive coil assembly having a bore. The superconductive coil assembly includes several radially-aligned and longitudinally spaced-apart superconductive main coils each carrying a large, identical electric current in the same direction. The superconductive main coils are thus designed to create a magnetic field of high uniformity within a typically spherical imaging volume centered within the magnet's bore where the object to be imaged is placed. A single, tubular-shaped superconductive shielding assembly may also be used to prevent the high magnetic field created by and surrounding the main coils from adversely interacting with electronic equipment in the vicinity of the magnet. Such shielding assembly includes several radially-aligned and longitudinally spaced-apart superconductive shielding coils carrying electric currents of generally equal amperage, but in an opposite direction, to the electric current carried in the main coils and positioned radially outward of the main coils.

Open magnets, including "C" shape magnets, typically employ two spaced-apart superconductive coil assemblies with the space between the assemblies containing the imaging volume and allowing for access by medical personnel for surgery or other medical procedures during magnetic resonance imaging. The patient may be positioned in that space or also in the bore of the toroidal-shaped coil assemblies. The open space helps the patient overcome any feelings of claustrophobia that may be experienced in a closed magnet design. Known open and shielded superconductive magnet designs include those wherein each superconductive coil assembly has an open bore and contains a superconductive shielding coil positioned longitudinally and radially outward from the superconductive main coil(s). A large amount of expensive superconductor is needed in the main coil to overcome the magnetic field subtracting effects of the shielding coil. Calculations show that for a 0.75 Tesla magnet, generally 2,300 pounds of superconductor are needed yielding an expensive magnet weighing generally 12,000 pounds. The modest weight makes this a viable magnet design.

It is also known in open magnet designs to place an iron pole piece in the bore of a superconductive coil assembly which lacks a superconductive shielding coil. The iron pole piece enhances the strength of the magnetic field and, by shaping the surface of the pole piece, improves the homogeneity of the magnetic field. An iron return path is used to connect the two iron pole pieces. It is noted that the iron pole piece also acts to shield the magnet. However, a large amount of iron is needed in the iron pole piece to achieve shielding in strong magnets. Calculations show that for a 0.75 Tesla magnet, only generally 200 pounds of superconductor are needed yielding a magnet weighing over 70,000 pounds which is too heavy to be used in medical facilities such as hospitals. The weight does not make this a viable magnet design.

What is needed is an open and shielded superconductive magnet design which is light enough to be used in medical facilities and which is less expensive than known designs.

SUMMARY OF THE INVENTION

The open superconductive magnet of the invention includes a first assembly and a second assembly. The first assembly includes a magnetizable and generally cylindrical-shaped first pole piece, a magnetizable and generally annular-shaped first ring, a generally annular-shaped first superconductive main coil, and a generally annular-shaped first superconductive shielding coil. The first pole piece has a generally longitudinal first axis. The first ring is generally coaxially aligned with the first axis and is radially spaced outwardly apart from and at least partially longitudinally overlaps the first pole piece. The first superconductive main coil is generally coaxially aligned with the first axis, positioned radially between and spaced apart from the first pole piece and the first ring, and carries a first main electric current in a first direction. The first superconductive shielding coil is generally coaxially aligned with the first axis, positioned radially outward and spaced apart from the first superconductive main coil, positioned longitudinally outward and spaced apart from the longitudinally outer end of the first ring, and carries a first shielding electric current in a direction opposite to the first direction.

The second assembly includes a magnetizable and generally cylindrical-shaped second pole piece, a magnetizable and generally annular-shaped second ring, a generally annular-shaped second superconductive main coil, and a generally annular-shaped second superconductive shielding coil. The second pole piece is longitudinally spaced apart from the first pole piece and is without a magnetizable solid path to the first pole piece. The second pole piece has a generally longitudinal second axis generally coaxially aligned with the first axis. The second ring is generally coaxially aligned with the second axis and is radially spaced outwardly apart from and at least partially longitudinally overlaps the second pole piece. The second superconductive main coil is generally coaxially aligned with the second axis, positioned radially between and spaced apart from the second pole piece and the second ring, and carries a second main electric current in the previously-mentioned first direction. The second superconductive shielding coil is generally coaxially aligned with the second axis, positioned radially outward and spaced apart from the second superconductive main coil, positioned longitudinally outward and spaced apart from the longitudinally outer end of the second ring, and carries a second shielding electric current in the previously-mentioned opposite direction. In an exemplary construction, the rings and the pole pieces consist essentially of iron.

Several benefits and advantages are derived from the invention. The pole piece and the ring enhance the strength of the magnetic field so less superconductor is needed in the main coil. The iron ring provides a partial magnetic flux return for the main coil which reduces the iron needed in the pole piece and which reduces the amount of superconductor needed in the main coil. The iron ring also magnetically decouples the shielding coil from the main coil so that the magnetic flux lines from the shielding coil are captured by the iron ring and do not reach the magnetic flux lines from the main coil. Thus the iron mass of the pole piece does not have to be increased, and the amount of the superconductor in the main coil does not have to be increased, to offset the field subtracting effects of the magnetic flux lines from the shielding coil, since they are blocked by the presence of the iron ring. Computer simulations show that a 0.75 Tesla magnet of the present invention would use generally 500 pounds of superconductor yielding a magnet weighing generally 15,000 pounds (which is light enough to be installed in a medical facility) and costing only half of what a viable equivalent conventional magnet would cost.

DETAILED DESCRIPTION OF THE INVENTION

Figure 1:
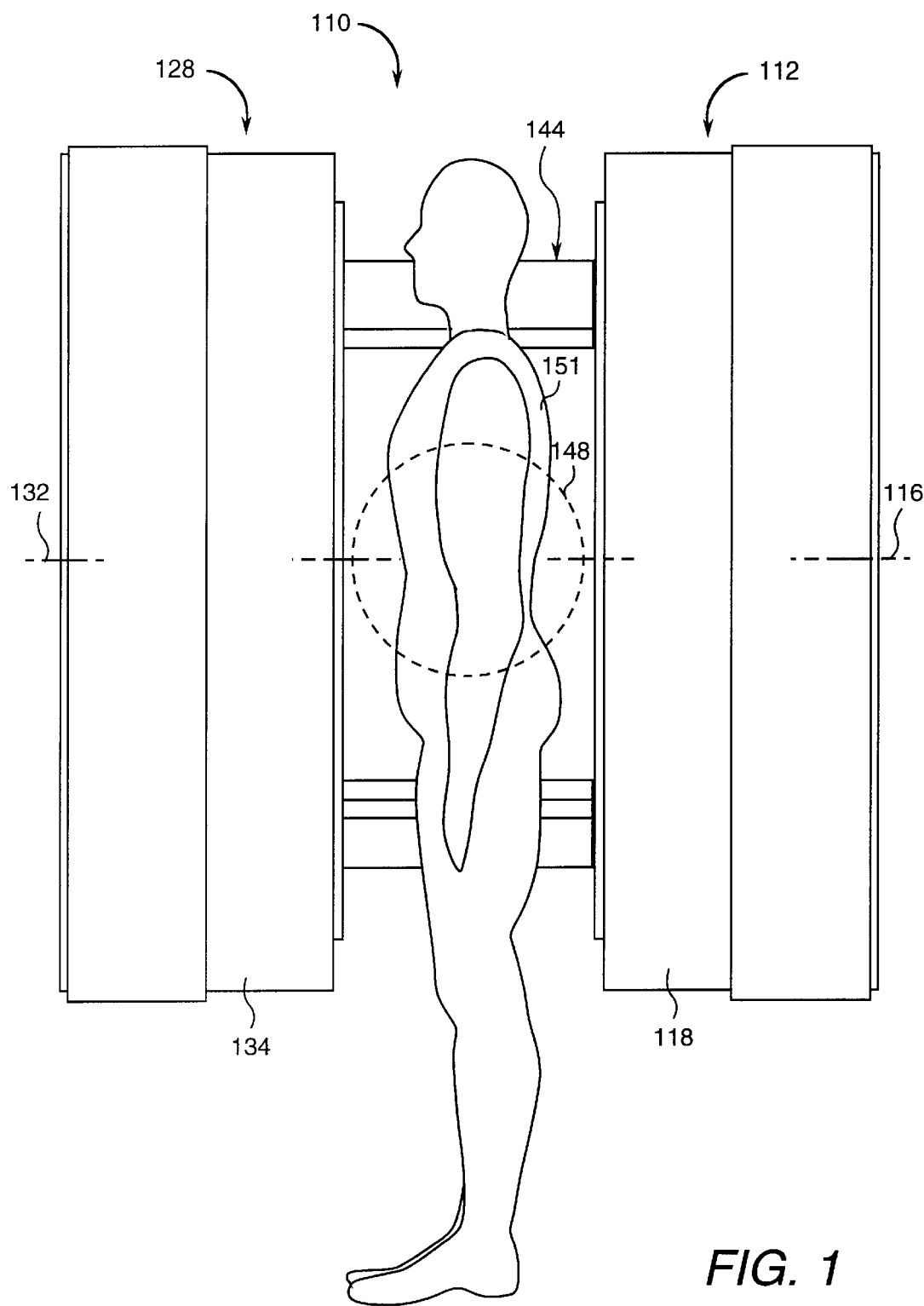
FIG. 1 is a schematic front elevational view of a first preferred embodiment of the open superconductive magnet of the invention.
Figure 2:
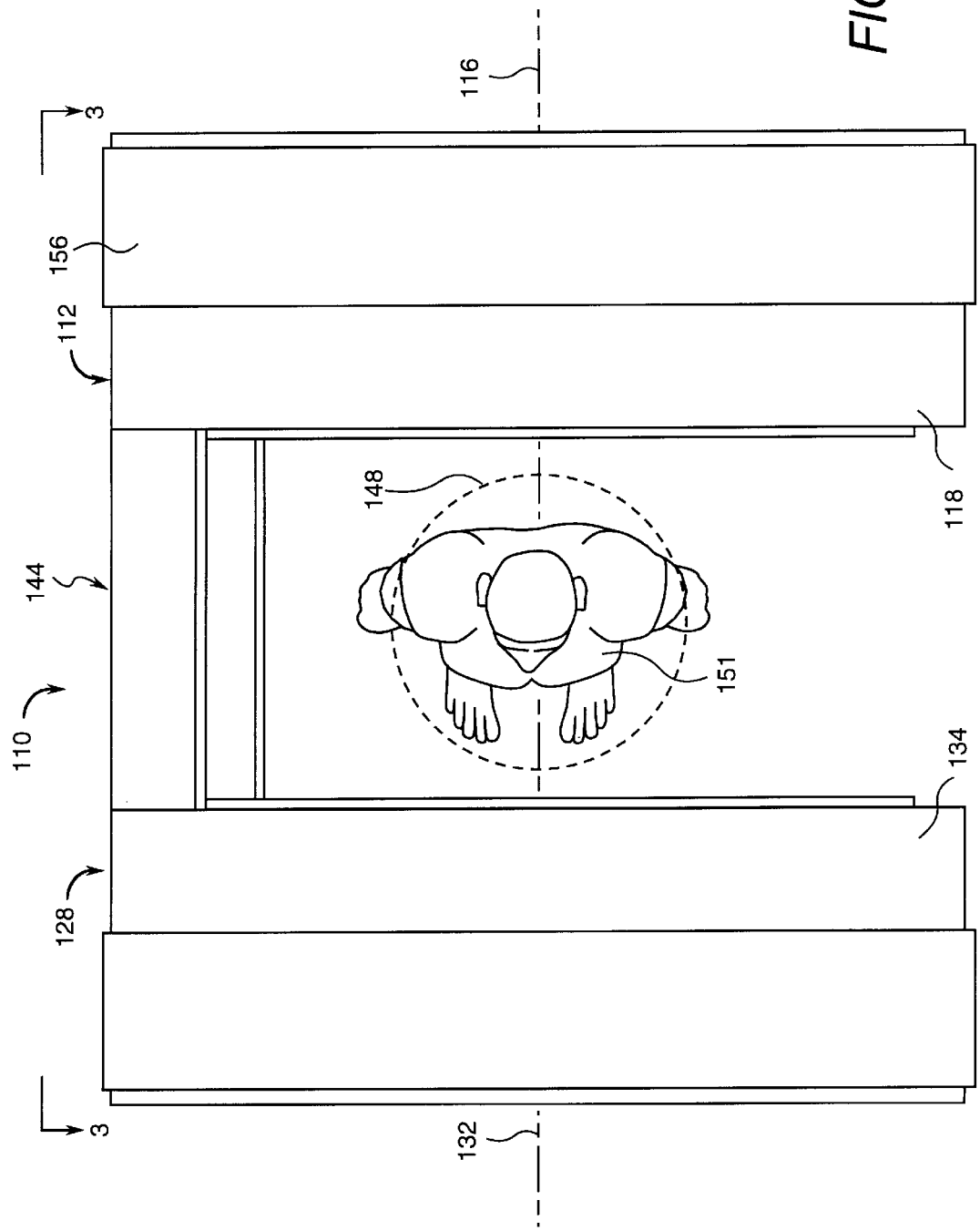
FIG. 2 is a schematic top planar view of the magnet of FIG. 1.
Figure 3:
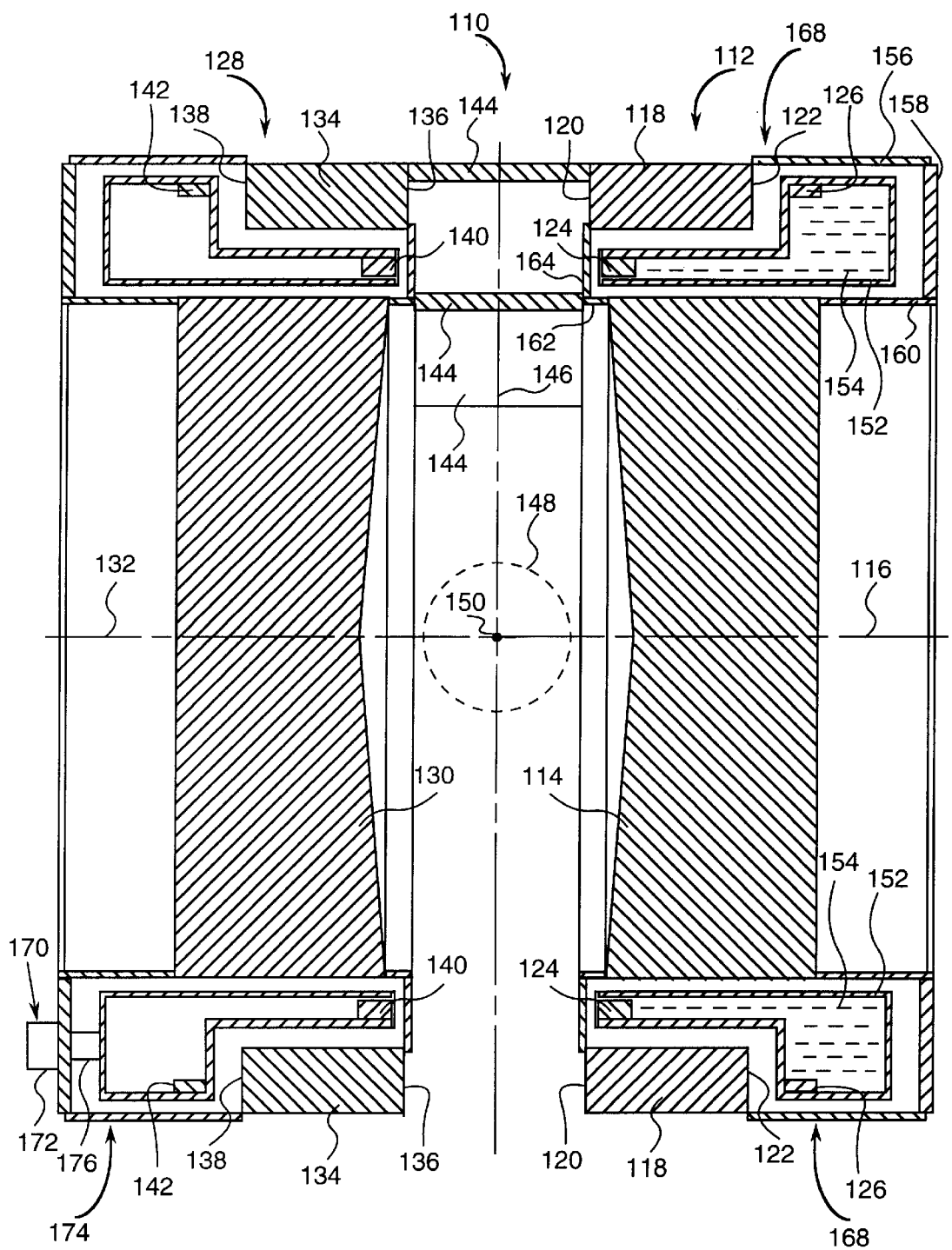
FIG. 3 is a cross sectional view of the magnet of FIGS. 1 and 2 taken along lines 3—3 of FIG. 2 with the addition of a cryocooler coldhead.

Referring now to the drawings, wherein like numerals represent like elements throughout, FIGS. 1–3 show a first preferred embodiment of the open superconductive magnet 110 of the present invention. Preferably, the magnet 110 is a 0.5 Tesla or higher magnet. The magnet 110 includes a first assembly 112. The first assembly 112 includes a magnetizable and generally cylindrical-shaped first pole piece 114 having a generally longitudinal first axis 116. Preferably the first pole piece 114 consists essentially of a ferromagnetic material. In a preferred construction, the first pole piece 114 consists essentially of iron.

The first assembly 112 also includes a magnetizable and generally annular-shaped first ring 118 generally coaxially aligned with the first axis 116. The first ring 118 is radially spaced outwardly apart from, and at least partially longitudinally overlaps, the first pole piece 114. The first ring 118 has a longitudinally inner end 120 and a longitudinally outer end 122. Preferably the first ring 118 consists essentially of a ferromagnetic material. In a preferred construction, the first ring 118 consists essentially of iron.

The first assembly 112 additionally includes a generally annular-shaped first superconductive main coil 124 generally coaxially aligned with the first axis 116 and disposed radially between, and spaced apart from, the first pole piece 114 and the first ring 118. By "disposed radially between" is meant, in this instance, that the radial distance of the first superconductive main coil 124 from the first axis 116 falls between the radius of the first pole piece 114 and the inside radius of the first ring 118, and that the first ring 118 does not have to longitudinally overlap, to any extent, the first superconductive main coil 124 and that the first superconductive main coil 124 does not have to longitudinally overlap, to any extent, the first pole piece 114. The first superconductive main coil 124 carries a first main electric current in a first direction. The first direction is defined to be either a clockwise or a counterclockwise circumferential direction about the first axis 116 with any slight longitudinal component of current direction being ignored. It is noted that additional first superconductive main coils may be needed to achieve a high magnetic field strength, within the magnet's imaging volume, without exceeding the critical current density of the superconductor being used in the superconductive coils, as is known to those skilled in the art. A preferred superconductor for the first superconductive main coil 124 is niobium-titanium.

The first assembly 112 moreover includes a generally annular-shaped first superconductive shielding coil 126 generally coaxially aligned with the first axis 116. The first superconductive shielding coil 126 is disposed radially outward, and spaced apart, from the first superconductive main coil 124, and is disposed longitudinally outward, and spaced apart, from the longitudinally outer end 122 of the first ring 118. The first superconductive shielding coil 126 carries a first shielding electric current in a direction opposite to the previously-defined first direction. A preferred superconductor for the first superconductive shielding coil 126 is niobium-titanium.

The open superconductive magnet 110 also includes a second assembly 128. The second assembly 128 includes a magnetizable and generally cylindrical-shaped second pole piece 130 longitudinally spaced apart from, and without a magnetizable solid path to, the first pole piece 114. The second pole piece 130 has a generally longitudinal second axis 132 which is generally coaxially aligned with the first axis 116. Preferably the second pole piece 130 consists essentially of a ferromagnetic material. In a preferred construction, the second pole piece 130 consists essentially of iron.

The second assembly 128 also includes a magnetizable and generally annular-shaped second ring 134 generally coaxially aligned with the second axis 132. The second ring 134 is radially spaced outwardly apart from, and at least partially longitudinally overlaps, the second pole piece 130. The second ring 134 has a longitudinally inner end 136 and a longitudinally outer end 138. The longitudinally inner ends 120 and 136 of the first and second rings 118 and 134 are longitudinally closer to each other than are the longitudinally outer ends 122 and 138 of the first and second rings 118 and 134. Preferably the second ring 134 consists essentially of a ferromagnetic material. In a preferred construction, the second ring 134 consists essentially of iron.

The second assembly 128 additionally includes a generally annular-shaped second superconductive main coil 140 generally coaxially aligned with the second axis 132 and disposed radially between, and spaced apart from, the second pole piece 130 and the second ring 134. The second superconductive main coil 140 carries a second main electric current in the previously-defined first direction. It is noted that additional second superconductive main coils may be needed to balance any additional first superconductive main coils present in the first assembly, as is known to those skilled in the art. A preferred superconductor for the second superconductive main coil 140 is niobium-titanium.

The second assembly 128 moreover includes a generally annular-shaped second superconductive shielding coil 142 generally coaxially aligned with the second axis 132. The second superconductive shielding coil 142 is disposed radially outward, and spaced part, from the second superconductive main coil 140, and is disposed longitudinally outward, and spaced apart, from the longitudinally outer end 138 of the second ring 134. The second superconductive shielding coil 142 carries a second shielding electric current in a direction opposite to the previously-defined first direction. A preferred superconductor for the second superconductive shielding coil 142 is niobium-titanium.

In an exemplary construction, the open superconductive magnet 110 includes only one support member 144 connecting the first and second assemblies 112 and 128, wherein the support member 144 is a nonmagnetizable support member preferably consisting essentially of nonmagnetic stainless steel. Preferably, the support member 144 and the first and second assemblies 112 and 128 together have a generally "C" shape when viewed in a cross section created by a cutting plane, wherein the first axis 116 lies completely in the cutting plane, and wherein the cutting plane generally bisects the support member 144. It is noted that the previously-defined cross section is the cross section shown in FIG. 3, with the "C" shape seen by rotating FIG. 3 ninety degrees counterclockwise.

Preferably, the second assembly 128 is a general mirror image of the first assembly 112 about a plane 146 (seen on edge as a dashed line in FIG. 3) disposed longitudinally equidistant between the first and second assemblies 112 and 128 and oriented generally perpendicular to the first axis 116. When the magnet 110 is employed as an MRI (magnetic resonance imaging) magnet, the magnet 110 includes a magnetic resonance imaging volume 148 (seen as a dotted line in FIGS. 1–3) disposed generally longitudinally equidistant between the first and second assemblies 112 and 128. It is preferred that the imaging volume is a generally spherical imaging volume having a center 150 lying generally on the first axis 116. A patient 151 is shown in an imaging position in FIGS. 1 and 2.

It is noted that the superconductive coils 124, 126, 140, and 142 are cooled, to a temperature below their critical temperature to achieve and sustain superconductivity, preferably by liquid-helium (or other cryogenic) cooling, by cryocooler cooling, or by a combination thereof. In a first cooling option, illustrated in the first assembly 112, the magnet 110 also includes a first cryogenic vessel 152 surrounding the first superconductive main and shielding coils 124 and 126, wherein the first pole piece 114 and the first ring 118 are disposed outside and spaced apart from the first cryogenic vessel 152. The first cryogenic vessel 152 contains a liquid cryogen 154, such as liquid helium. Preferably, the first cryogenic vessel 152 consists essentially of aluminum or nonmagnetic stainless steel. Here, the magnet 110 further includes a plurality of plates 156, 158, 160, 162, 164, and 166 which, together with the first ring 118 and the first pole piece 114 define a first vacuum enclosure 168 which surrounds and which is spaced apart from the first cryogenic vessel 152. Preferably, the plates 156, 158, 160, 162, 164, and 166 consist essentially of nonmagnetic stainless steel.

In a second cooling option, illustrated in the second assembly 128, the magnet 110 also includes a cryocooler coldhead 170 having a housing 172 attached to the second vacuum enclosure 174 and having a cold stage 176 in solid thermal conduction contact with the second superconductive main and shielding coils 140 and 142.

Other cooling options (not shown in the figures) include each assembly having its own cryogenic vessel, wherein the liquid cryogen in one cryogenic vessel is in fluid communication with the liquid cryogen in the other cryogenic vessel through conduits in the support member. Alternately, a solid thermal conduction path can be placed in the support member allowing the cryocooler coldhead on the second vacuum enclosure to also cool the superconductive main and shielding coil in the first vacuum enclosure. Typically one or more thermal shields (not shown in the figures) are spaced apart from, and surround, the superconductive main and shielding coils. For cryogenic-cooling, such thermal shields are located outside the cryogenic vessel. It is noted that the magnet 110 moreover includes, as needed, thermal spacers and coil forms, as is known to the artisan, for proper spacing and support of the magnet components, such spacers and coil forms being omitted from the figures for clarity.

Figure 4:
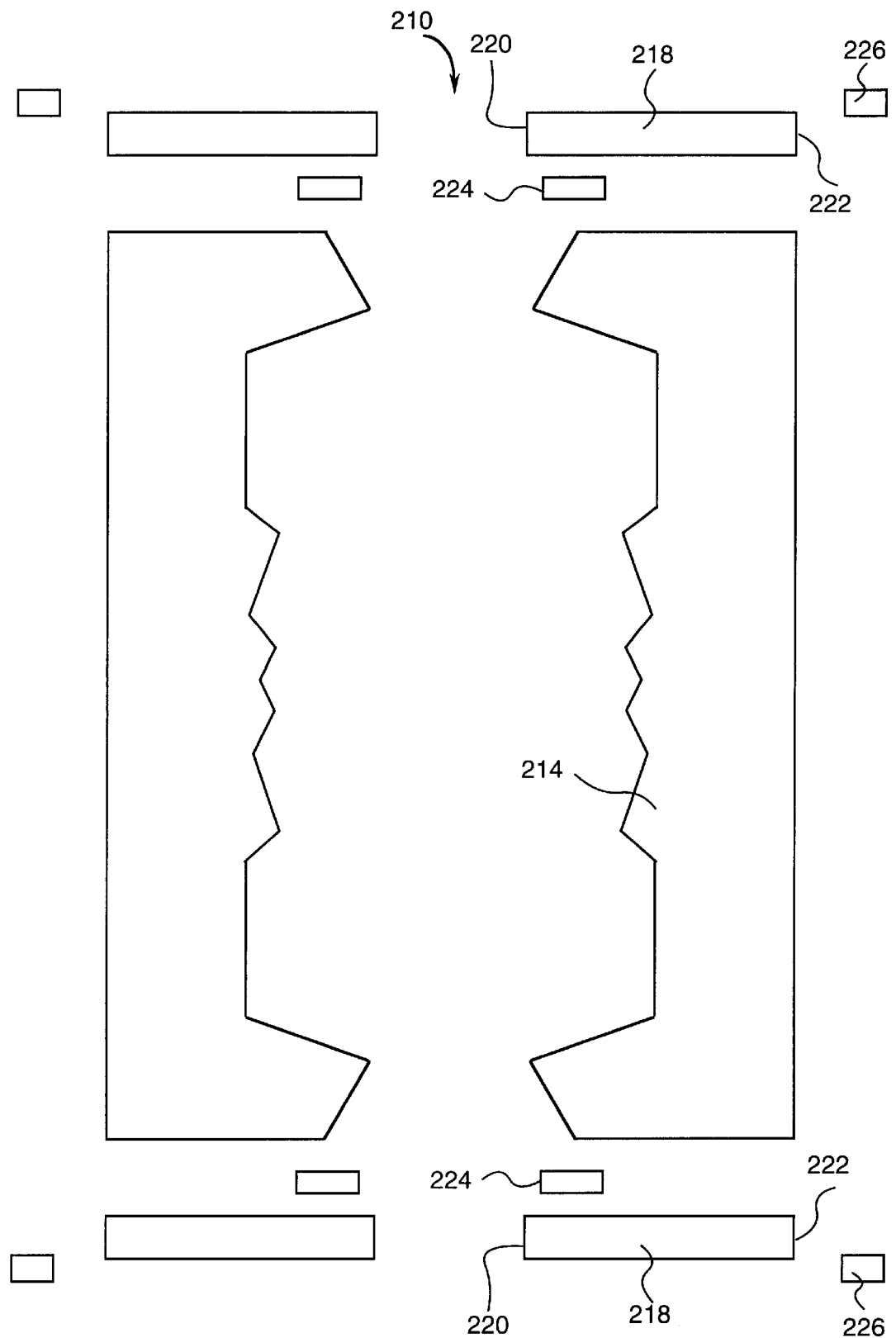
FIG. 4 is a cross sectional view, as in FIG. 3, but of a portion only of a second preferred embodiment of the magnet of the invention, such portion showing the arrangement of the pole pieces, rings, and superconductive main and shielding coils.

Referring again to the drawings, FIG. 4 shows a second preferred embodiment of the open superconductive magnet 210 of the present invention, such magnet 210 preferably being a generally 0.75 Tesla magnet. Here, the longitudinally inner and outer ends 220 and 222 of the first ring 218 are spaced a first longitudinal distance apart from each other, wherein the first superconductive main coil 224 is disposed a longitudinal distance, from the longitudinally inner end 220 of the first ring 218, which is less than generally one-half the first longitudinal distance. The first ring 218 generally completely longitudinally overlaps the first superconductive main coil 224, and the first superconductive main coil 224 partially overlaps the first pole piece 214. It is noted that a first magnet component can "completely longitudinally overlap" a second magnet component only when the first component is longitudinally longer than, and surrounds, the second component. The first ring 218 generally completely longitudinally overlaps the first pole piece 214. The first superconductive shielding coil 226 is disposed a longitudinal distance, from the longitudinally outer end 222 of the first ring 218, which is less than generally one-half the first longitudinal distance. The first ring 218 is disposed a first radial distance from the first pole piece 214, wherein the first superconductive shielding coil 226 is disposed a radial distance, from the first superconductive main coil 224, which is less than generally the first radial distance.

It is noted that those skilled in the art, using computer simulations based on conventional magnetic field analysis techniques, and using the teachings of the present invention, can design an open and shielded magnet of a desired magnetic field strength, a desired level of magnetic field inhomogenity, and a desired level of shielding (i.e., a desired position of the 5 Gauss stray field from the center of the imaging volume of the open superconductive magnet). As previously mentioned, the pole piece and the ring enhance the strength of the magnetic field so less superconductor is needed in the main coil. The iron ring provides a partial magnetic flux return for the main coil which reduces the iron needed in the pole piece and which reduces the amount of superconductor needed in the main coil. The iron ring also magnetically decouples the shielding coil from the main coil so that the magnetic flux lines from the shielding coil are captured by the iron ring and do not reach the magnetic flux lines from the main coil. Thus the iron mass of the pole piece does not have to be increased, and the amount of the superconductor in the main coil does not have to be increased, to offset the field subtracting effects of the magnetic flux lines from the shielding coil, since they are blocked by the presence of the iron ring. Computer simulations show that a 0.75 Tesla magnet of the present invention would use generally 500 pounds of superconductor yielding a magnet weighing generally 15,000 pounds (which is light enough to be installed in a medical facility) and costing only half of what a viable equivalent conventional magnet would cost.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. An open superconductive magnet comprising:
    a) a first assembly including:
        (1) a magnetizable and generally cylindrical-shaped first pole piece having a generally longitudinal first axis;
        (2) a magnetizable and generally annular-shaped first ring generally coaxially aligned with said first axis and radially spaced outwardly apart from and at least partially longitudinally overlapping said first pole piece, wherein said first ring has a longitudinally inner end and a longitudinally outer end;
        (3) a generally annular-shaped first superconductive main coil generally coaxially aligned with said first axis, disposed radially between and spaced apart from said first pole piece and said first ring, and carrying a first main electric current in a first direction; and
        (4) a generally annular-shaped first superconductive shielding coil generally coaxially aligned with said first axis, disposed radially outward and spaced apart from said first superconductive main coil, disposed longitudinally outward and spaced apart from said longitudinally outer end of said first ring, and carrying a first shielding electric current in a direction opposite to said first direction; and
    b) a second assembly including:
        (1) a magnetizable and generally cylindrical-shaped second pole piece longitudinally spaced apart from, and without a magnetizable solid path to, said first pole piece and having a generally longitudinal second axis generally coaxially aligned with said first axis;
        (2) a magnetizable and generally annular-shaped second ring generally coaxially aligned with said second axis and radially spaced outwardly apart from and at least partially longitudinally overlapping said second pole piece, wherein said second ring has a longitudinally inner end and a longitudinally outer end, and wherein said longitudinally inner ends of said first and second rings are longitudinally closer to each other than are said longitudinally outer ends of said first and second rings;
        (3) a generally annular-shaped second superconductive main coil generally coaxially aligned with said second axis, disposed radially between and spaced apart from said second pole piece and said second ring, and carrying a second main electric current in said first direction; and
        (4) a generally annular-shaped second superconductive shielding coil generally coaxially aligned with said second axis, disposed radially outward and spaced apart from said second superconductive main coil, disposed longitudinally outward and spaced apart from said longitudinally outer end of said second ring, and carrying a second shielding electric current in said opposite direction.

2. The magnet of claim 1, wherein said magnet also includes only one support member connecting said first and second assemblies, wherein said support member is a non-magnetizable support member, and wherein said support member and said first and second assemblies together have a generally "C" shape when viewed in a cross section of the magnet created by a cutting plane, wherein said first axis lies completely in said cutting plane, and wherein said cutting plane generally bisects said support member.

3. The magnet of claim 1, wherein said second assembly is a general mirror image of said first assembly about a plane disposed longitudinally equidistant between said first and second assemblies and oriented generally perpendicular to said first axis.

4. The magnet of claim 3, wherein said magnet also includes a magnetic resonance imaging volume disposed generally longitudinally equidistant between said first and second assemblies.

5. The magnet of claim 4, wherein said imaging volume is a generally spherical imaging volume having a center lying generally on said first axis.

6. The magnet of claim 3, wherein said magnet also includes a first cryogenic vessel surrounding said first superconductive main and shielding coils, and wherein said first pole piece and said first ring are disposed outside and spaced apart from said first cryogenic vessel, and wherein said first cryogenic vessel contains a liquid cryogen.

7. The magnet of claim 6, wherein said magnet also includes a plurality of plates, and wherein said plates, said first ring, and said first pole piece together define a first vacuum enclosure which surrounds and which is spaced apart from said first cryogenic vessel.

8. The magnet of claim 3, wherein said longitudinally inner and outer ends of said first ring are spaced a first longitudinal distance apart from each other, and wherein said first superconductive main coil is disposed a longitudinal distance, from said longitudinally inner end of said first ring, which is less than generally one-half said first longitudinal distance.

9. The magnet of claim 8, wherein said first ring generally completely longitudinally overlaps said first superconductive main coil.

10. The magnet of claim 9, wherein said first superconductive main coil partially overlaps said first pole piece.

11. The magnet of claim 10, wherein said first ring generally completely longitudinally overlaps said first pole piece.

12. The magnet of claim 11, wherein said first superconductive shielding coil is disposed a longitudinal distance, from said longitudinally outer end of said first ring, which is less than generally one-half said first longitudinal distance.

13. The magnet of claim 12, wherein said first ring is disposed a first radial distance from said first pole piece, and wherein said first superconductive shielding coil is disposed a radial distance, from said first superconductive main coil, which is less than generally said first radial distance.

14. The magnet of claim 3, wherein said first pole piece and said first ring each consist essentially of iron, and wherein said liquid cryogen consists essentially of liquid helium.

15. The magnet of claim 3, wherein said magnet also includes a cryocooler coldhead having a cold stage, and wherein said cold stage is in solid thermal conduction contact with said second superconductive main and shielding coils.

* * * * *